(12) United States Patent
Jackson et al.

(10) Patent No.: US 6,554,920 B1
(45) Date of Patent: Apr. 29, 2003

(54) HIGH-TEMPERATURE ALLOY AND ARTICLES MADE THEREFROM

(75) Inventors: Melvin Robert Jackson, Niskayuna, NY (US); Canan Uslu Hardwicke, Niskayuna, NY (US); Ji-Cheng Zhao, Niskayuna, NY (US); Charles Gitahi Mukira, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/683,113

(22) Filed: Nov. 20, 2001

(51) Int. Cl.$^7$ .................. C22C 19/05; C22C 5/04; C22C 30/00
(52) U.S. Cl. .............. 148/442; 148/428; 148/430; 420/444; 420/445; 420/462; 420/588
(58) Field of Search .................. 420/445, 456, 420/444, 462, 588; 148/428, 430, 442

(56) References Cited

U.S. PATENT DOCUMENTS

| | | | |
|---|---|---|---|
| 4,737,205 A | | 4/1988 | Selman et al. |
| 4,904,546 A | * | 2/1990 | Jackson ............... 428/661 |
| 6,071,470 A | | 6/2000 | Koizumi et al. |

* cited by examiner

*Primary Examiner*—Roy King
*Assistant Examiner*—Harry D. Wilkins, III
(74) *Attorney, Agent, or Firm*—Paul J. DiConza; Noreen C. Johnson

(57) ABSTRACT

An alloy and repair material comprising the alloy, articles comprising the alloy and repair material, and methods for repairing articles including provision of the alloy as repair material are described, with the alloy comprising ruthenium, nickel, aluminum, and chromium, wherein a microstructure of the alloy is essentially free of an $L1_2$-structured phase at temperatures greater than about 1000° C. and comprises an A3-structured phase and up to about 40 volume percent of a B2-structured phase.

58 Claims, 1 Drawing Sheet

HIGH-TEMPERATURE ALLOY AND ARTICLES MADE THEREFROM

BACKGROUND OF INVENTION

The present invention relates to materials designed to withstand high temperatures. More particularly, this invention relates to heat-resistant alloys for high-temperature applications, such as, for instance, gas turbine engine components of aircraft engines and power generation equipment.

There is a continuing demand in many industries, notably in the aircraft engine and power generation industries where efficiency directly relates to operating temperature, for alloys that exhibit sufficient levels of strength and oxidation resistance at increasingly higher temperatures. Gas turbine airfoils on such components as vanes and blades are usually made of materials known in the art as "superalloys." The term "superalloy" is usually intended to embrace iron-, cobalt-, or nickel-based alloys, which include one or more additional elements to enhance high temperature performance, including such non-limiting examples as aluminum, tungsten, molybdenum, titanium, and iron. The term "based" as used in, for example, "nickel-based superalloy" is widely accepted in the art to mean that the element upon which the alloy is "based" is the single largest elemental component by weight in the alloy composition. Generally recognized to have service capabilities limited to a temperature of about 1100° C., conventional superalloys used in gas turbine airfoils often operate at the upper limits of their practical service temperature range. In jet engines, for example, bulk average airfoil temperatures range from about 900° C. to about 1000° C., while airfoil leading and trailing edge and tip temperatures can reach about 1150° C. or more. At such elevated temperatures, the oxidation process consumes conventional superalloy parts, forming a weak, brittle metal oxide that is prone to chip or spall away from the part.

Erosion and oxidation of material at the edges of airfoils lead to degradation of turbine efficiency. As airfoils are worn away, gaps between components become excessively wide, allowing gas to leak through the turbine stages without the flow of the gas being converted into mechanical energy. When efficiency drops below specified levels, the turbine must be removed from service for overhaul and refurbishment. A significant portion of this refurbishment process is directed at the repair of the airfoil leading and trailing edges and tips. For example, damaged material is removed and then new material built onto the blade by welding with filler material or by laser deposition of metal powders. The performance of alloys commonly used for repair is comparable or inferior to that of the material of the original component, depending upon the microstructure of the repaired material, its defect density due to processing, and its chemistry. Furthermore, in current practice, the original edge material is made of the same material as the rest of the original blade, often a superalloy based on nickel or cobalt. Because this material was selected to balance the design requirements of the entire blade, it is generally not optimized to meet the special local requirements demanded by conditions at the airfoil leading or trailing edges. However, maximum temperatures, such as those present at airfoil tips and edges, are expected in future applications to be over about 1300° C., at which point many conventional superalloys begin to melt. Clearly, new materials for repair and manufacture must be developed to improve the performance of repaired components and to exploit efficiency enhancements available to new components designed to operate at higher turbine operating temperatures.

Maximum temperatures are expected in future applications to be over about 1300° C., at which point many conventional superalloys begin to melt. Clearly, new materials must be developed if the efficiency enhancements available at higher operating temperatures are to be exploited.

The so-called "refractory superalloys," as described in Koizumi et al., U.S. Pat. No. 6,071,470, represent a class of alloys designed to operate at higher temperatures than those of conventional superalloys. According to Koizumi et al., refractory superalloys consist essentially of a primary constituent selected from the group consisting of iridium (Ir), rhodium (Rh), and a mixture thereof, and one or more additive elements selected from the group consisting of niobium (Nb), tantalum (Ta), hafnium (Hf), zirconium (Zr), uranium (U), vanadium (V), titanium (Ti), and aluminum (Al). The refractory superalloys have a microstructure containing an FCC (face-centered cubic)-type crystalline structure phase and an L12 type crystalline structure phase, and the one or more additive elements are present in a total amount within the range of from 2 atom % to 22 atom %.

SUMMARY OF INVENTION

Although the refractory superalloys have shown potential to become replacements for conventional superalloys in present and future gas turbine engine designs, it has been shown that many alloys of this class do not meet all of the desired performance criteria for high-temperature applications. Therefore, the need persists for alloys with improved high-temperature properties.

The present invention provides several embodiments that address this need. One embodiment provides an alloy comprising ruthenium, nickel, aluminum, and chromium, wherein a microstructure of the alloy is essentially free of an $L1_2$-structured phase at temperatures greater than about 1000° C. and comprises an A3-structured phase and up to about 40 volume percent of a B2-structured phase.

A second embodiment provides a gas turbine engine component comprising: an alloy comprising ruthenium, nickel, aluminum, and chromium, wherein a microstructure of the alloy of the engine component is essentially free of an $L1_2$-structured phase at temperatures greater than about 1000° C. and comprises an A3-structured phase and up to about 40 volume percent of a B2-structured phase.

A third embodiment provides a repair material for repairing superalloy articles, the repair material comprising ruthenium, nickel, aluminum, and chromium, wherein a microstructure of the repair material is essentially free of an $L1_2$-structured phase at temperatures greater than about 1000° C. and comprises an A3-structured phase and up to about 40 volume percent of a B2-structured phase.

A fourth embodiment provides a repaired gas turbine engine component comprising a repair material comprising ruthenium, nickel, aluminum, and chromium, wherein a microstructure of the repair material of the engine component is essentially free of an $L1_2$-structured phase at temperatures greater than about 1000° C. and comprises an A3-structured phase and up to about 40 volume percent of a B2-structured phase.

A fifth embodiment provides a method for repairing a gas turbine engine component, the method comprising providing a repair material, the repair material comprising ruthenium, nickel, aluminum, and chromium, wherein a microstructure of the repair material is essentially free of an $L1_2$-structured phase at temperatures greater than about 1000° C. and comprises an A3-structured phase and up to about 40 volume percent of a B2-structured phase; and joining the repair material to the gas turbine engine component.

BRIEF DESCRIPTION OF DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
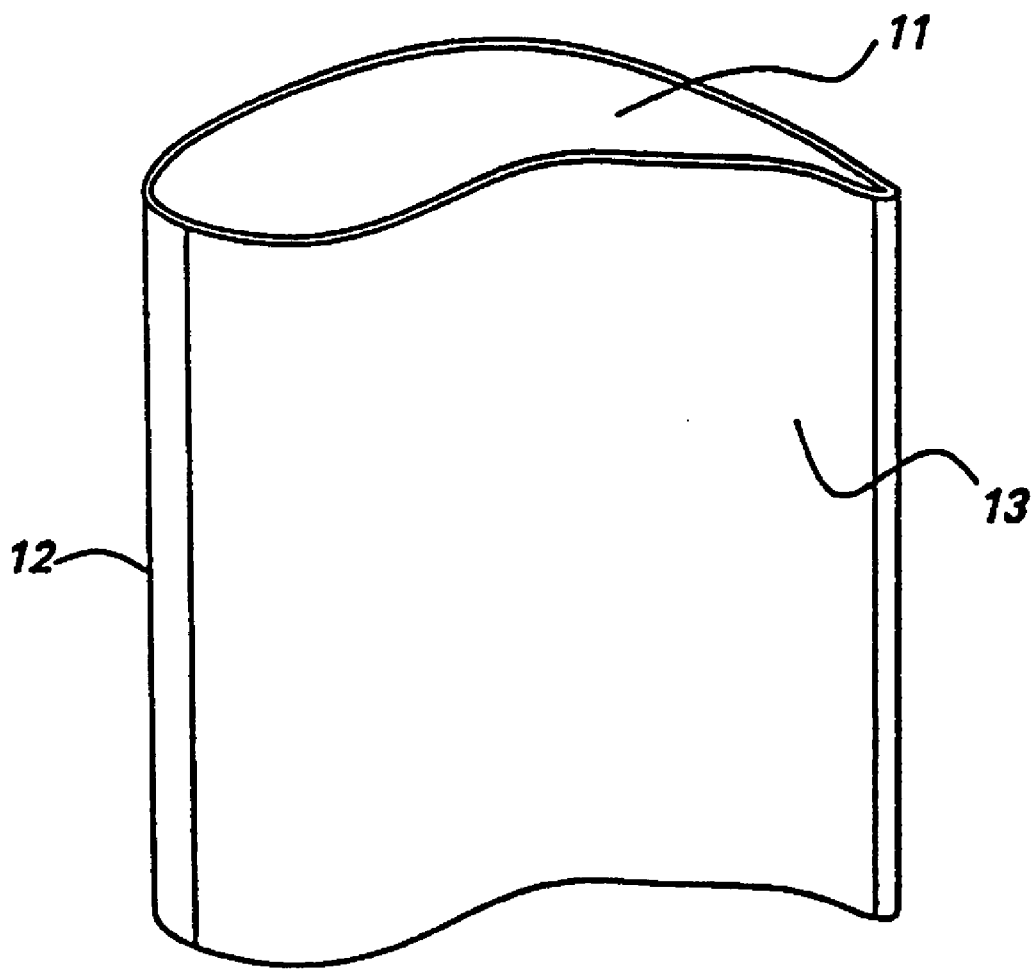
FIG. 1 is an isometric view of an airfoil as typically found on a gas turbine engine component.

The discussion herein employs examples taken from the gas turbine industry, particularly the portions of the gas turbine industry concerned with the design, manufacture, operation, and repair of aircraft engines and power generation turbines. However, the scope of the invention is not limited to only these specific industries, as the embodiments of the present invention are applicable to many and various applications that require materials resistant to high temperature and aggressive environments. Unless otherwise noted, the temperature range of interest where statements and comparisons are made concerning material properties is from about 1000° C. to about 1300° C. The term "high temperature" as used herein refers to temperatures above about 1000° C.

In several high temperature applications, such as, for example, gas turbines, the selection of structural materials is made based upon the performance of a number of different properties of the materials. For gas turbine components, including, for example, turbine blades (also known as "buckets") and vanes (also known as "nozzles"), wherein the maximum metal temperatures typically range from about 1000° C. to over about 1200° C. in present systems and wherein temperatures over about 1300° C. are envisioned for future applications, the properties that are considered include, for example, oxidation resistance, melting temperature (the temperature at which liquid metal begins to form as the material is heated), strength, coefficient of thermal expansion, modulus of elasticity, and cost.

The term "oxidation resistance" is used in the art to refer to the amount of damage sustained by a material when exposed to oxidizing environments, such as, for example, high temperature gases containing oxygen. Oxidation resistance is related to the rate at which the weight of a specimen changes per unit surface area during exposure at a given temperature. In many cases, the weight change is measured to be a net loss in weight as metal is converted to oxide that later detaches and falls away from the surface. In other cases, a specimen may gain weight if the oxide tends to adhere to the specimen, or if the oxide forms within the specimen, underneath the surface, a condition called "internal oxidation." A material is said to have "higher" or "greater" oxidation resistance than another if the material's rate of weight change per unit surface area is closer to zero than that of the other material for exposure to the same environment and temperature. Numerically, oxidation resistance can be represented by the time over which an oxidation test was run divided by the absolute value of the weight change per unit area.

"Strength" as used herein refers to the ultimate tensile strength of a material, which is defined in the art to mean the maximum load sustained by a specimen in a standard tensile test divided by the original cross-sectional area (i.e., the cross-sectional area of the specimen prior to applying the load).

Refractory superalloys, with their high content of highly environmentally resistant elements such as iridium and rhodium, represent a class of materials with potential for use in high temperature applications. However, as the data in Table 1 indicate, several refractory superalloys with compositions according to aforementioned U.S. Pat. No. 6,071,470 do not approach the oxidation resistance of a standard nickel-based superalloy at a temperature of about 1200° C.

TABLE 1

Oxidation resistance for selected alloys

| Alloy Designation (composition numbers refer to atomic percent) | Oxidation Resistance (hr-cm$^2$/mg) 100 hr. test at about 1200° C. |
|---|---|
| 1-A (Nickel-based superalloy) | 16.7 |
| 1-B (15 Zr + bal. Ir) | 0.9 |
| 1-C (7 Zr + bal. Rh) | 7.1 |
| 1-D (10 Zr + 6 Nb + bal. Rh) | 1.2 |

Refractory superalloys, like many conventional nickel-based superalloys, obtain their strength in large part due to the presence of a dispersion of fine precipitates comprising an $L1_2$-structured phase. Alloy strength generally increases as the volume percentage of this precipitate phase in the alloy microstructure increases. However, in order to form the $L1_2$-structured phase in refractory superalloys, environmentally resistant elements such as, for example, rhodium, must be partially replaced with elements that promote the formation of this phase, such as, for example, niobium (Nb), tantalum (Ta), hafnium (Hf), zirconium (Zr), uranium (U), vanadium (V), titanium (Ti), and aluminum (Al). The presence of these elements, while enhancing strength, causes a decrease in the oxidation resistance of the refractory superalloys. As disclosed in U.S. patent application Ser. No. 09/682,391, now abandoned, commonly owned by the present assignee, only certain specific formulations of refractory superalloys comprising the $L1_2$-structured phase possess levels of performance for a combination of oxidation resistance and strength that is acceptable for use in particular applications, such as, for example, gas turbine engines. These specific formulations tend to have high concentrations, that is, greater than about 90 atomic percent, of platinum group metals, such as, for example, rhodium. Such high concentrations cause these alloys to have disadvantageously high levels for certain properties that in many industries are generally preferred to be low, including, for example, density and cost.

In contrast to the refractory superalloys of Koizumi et al., certain embodiments of the present invention are alloys that are essentially free of the $L1_2$-structured phase at a temperature greater than about 1000° C. The term "essentially free" as used herein means that an alloy microstructure contains less than about 5 volume percent of the indicated phase, in this case the $L1_2$-structured phase. Formulation of alloys for high-temperature use is dependent upon an understanding of the property requirements needed for particular applications, and the relationship between alloy composition and properties. Some embodiments of the present invention represent specific "windows" of composition based upon such an understanding.

One embodiment of the present invention provides an alloy comprising ruthenium (Ru), nickel (Ni), aluminum (Al), and chromium (Cr). A microstructure of the alloy is essentially free of an $L1_2$-structured phase at temperatures greater than about 1000° C. and comprises an A3-structured (also referred to as "hexagonal close-packed" or HCP) phase and up to about 40 volume percent of a B2-structured phase. The A3-structured phase comprises a solid solution of Ru and other elements such as, for example, Cr and Ni, and is commonly referred to in the art as "epsilon phase," or $\epsilon$. The B2-structured phase, herein alternatively referred to as "beta phase" or "β", is represented by the general chemical formula MAl, where M is at least one of a number of elements, such as, for example, ruthenium and nickel, that can combine with aluminum to form a compound having the B2 crystal structure. Beta phase is a strong intermetallic compound, and its presence in the microstructure of the alloy of the present invention adds strength to the alloy, but at the cost of some ductility. In some embodiments of the present invention, β is present in the microstructure in an amount ranging from about 15 volume percent to about 40 volume percent. In particular embodiments, β is present in the microstructure in an amount ranging from about 20 volume percent to about 35 volume percent. Maintaining the concentration of β in the above ranges allows the alloy of the present invention to have a desirable combination of both strength and ductility. Advantageously, the presence of the B2-structured phase does not deleteriously affect oxidation resistance in the alloy of the present invention to the same degree as the $L1_2$-structured phase affects this property in refractory superalloys.

The addition of elements of comparatively low density relative to ruthenium, such as, for example, nickel, aluminum, and chromium, maintains the overall density of the alloy of the present invention to levels below those of many refractory superalloys. In some embodiments, the alloy of the present invention has a density of less than about 9.5 g/cc (Ni-free alloys), and in particular embodiments, the present alloy has a density of less than about 9 g/cc.

The composition of the alloy of the present invention comprises a sufficient quantity of Ru to stabilize the HCP epsilon phase in favor of the face-centered cubic (FCC) phase commonly associated with nickel-based superalloys and refractory superalloys, and known in the art as the "gamma" phase. A small amount of FCC phase, such as, for example, up to about 15 volume percent, is acceptable in alloys of the present invention, but experience during the development of alloys of the present invention suggests that stabilizing the epsilon phase in favor of the gamma phase achieves desirable performance levels for a carefully selected array of properties, such as, for example, oxidation resistance. In certain embodiments, the ruthenium is present in an amount ranging from about 20 atomic percent to about 40 atomic percent, the chromium is present in an amount ranging from about 10 atomic percent to about 28 atomic percent, the aluminum is present in an amount ranging from about 12 atomic percent to about 24 atomic percent, and the balance comprises nickel, wherein the nickel is present in an amount of at least about 30 atomic percent. In particular embodiments, the ruthenium is present in an amount ranging from about 20 atomic percent to about 25 atomic percent, the chromium is present in an amount ranging from about 20 atomic percent to about 25 atomic percent, and the aluminum is present in an amount ranging from about 13 atomic percent to about 16 atomic percent. Maintaining Al and Cr at these levels allows thin, protective oxide scale formation when the alloy is exposed to high temperatures, which enhances the ability of the alloy to resist further oxidation. Additions of Cr also advantageously promote the stability of the $\epsilon$ phase in alloys of the present invention.

The overall composition of the alloy of the present invention is controlled to achieve desirable levels for a number of properties. In some embodiments, the alloy of the present invention has an ultimate tensile strength greater than about 100 MPa at a temperature of about 1200° C., and in certain embodiments, the present alloy has an ultimate tensile strength greater than about 150 MPa at a temperature of about 1200° C. In other embodiments, the alloy of the present invention has an oxidation resistance of at least about 30 hour-$cm^2$/mg at a temperature of about 1200° C. In particular embodiments, the alloy of the present invention has an oxidation resistance of at least about 60 hour-$cm^2$/mg at a temperature of about 1200° C.

Some embodiments of the present invention provide for the addition of further alloying elements. In some embodiments, the alloy of the present invention further comprises up to about 1.5 atomic percent of a metal selected from the group consisting of zirconium, tantalum, hafnium, niobium, yttrium, molybdenum, and mixtures thereof (herein referred to as "transition metal strengtheners"); and up to about 10 atomic percent of a metal selected from the group consisting of platinum, palladium, rhodium, and mixtures thereof. The addition of transition metal strengtheners achieves a certain amount of solid solution strengthening, wherein the transition metal strengthener remains dissolved in the $\epsilon$ phase and hardens the $\epsilon$ phase by straining the surrounding HCP crystal structure. Additionally, as an alloy of the present invention comprising transition metal strengtheners is exposed to air under high-temperature service conditions or during a heat treatment in air, the transition metal strengthener oxidizes to form a uniform dispersion of very small, very hard oxide particles that reinforces the $\epsilon$ phase and provides significant high temperature strength.

To further capitalize upon the benefits described above, certain embodiments of the present invention provide an alloy comprising about 22 atomic percent ruthenium, about 25 atomic percent chromium, about 15 atomic percent aluminum, about 0.2 atomic percent zirconium, and the balance comprising nickel, wherein a microstructure of the alloy is essentially free of an $L1_2$-structured phase at temperatures greater than about 1000° C. and comprises an A3-structured phase and from about 15 volume percent to about 40 volume percent of a B2-structured phase. Alloys of the present invention with compositions in keeping with the above ranges have shown desirable levels of performance with respect to such properties as, for example, oxidation resistance, strength, and density.

Those skilled in the art will appreciate that additions of carbon and boron to the embodiments of the present invention may marginally improve strength and other properties as they do in many other alloy systems, and that such additions are generally up to about 0.25 atomic percent for each of these two elements. Furthermore, incidental impurities, such as cobalt, iron, and other metals, are often present in processed alloys and may be present in alloys provided by the present invention in amounts of up to about 0.5 atomic percent, for example. In particular embodiments, the alloy of the present invention consists essentially of ruthenium, in an amount ranging from about 20 atomic percent to about 40 atomic percent; chromium, in an amount ranging from about 10 atomic percent to about 28 atomic percent; aluminum, in an amount ranging from about 12 atomic percent to about 24 atomic percent; up to about 1.5 atomic percent of a metal selected from the group consisting of zirconium, tantalum, hafnium, niobium, yttrium, molybdenum, and mixtures thereof; up to about 10 atomic percent of a metal selected from the group consisting of platinum, palladium, rhodium, and mixtures thereof; and the balance nickel, wherein the nickel is present in an amount of at least about 30 atomic percent; wherein a microstructure of said alloy is essentially free of an $L1_2$-structured phase at temperatures greater than about 1000° C. and comprises an A3-structured phase and from about 15 volume percent to about 40 volume percent of a B2-structured phase.

Another embodiment of the present invention provides a gas turbine engine component comprising the alloy of the present invention. The alternatives for composition and properties of the alloy in these gas turbine engine component embodiments are the same as discussed above for the alloy embodiments. Yet another embodiment provides a repair material for repairing superalloy articles, the repair material comprising the alloy of the present invention, again with the same alternatives for composition and properties of the alloy as set forth above. Repair material is generally used to replace damaged material on a component during the repair of a component. The repair material of the present invention is suitable for use as repair material in a number of commonly used forms, including, for example, powder and weld rod. A further embodiment of the present invention provides a repaired gas turbine engine component comprising repair material, the repair material comprising the alloy of the present invention. A still further embodiment of the present invention provides a method for repairing a gas turbine engine component, the method comprising providing a repair material, the repair material comprising the alloy of the present invention; and joining the repair material to the gas turbine engine component. The repair material is provided in any of a number of suitable forms, including, for example, powder and weld rod, and the joining step is accomplished by any of a number of joining processes, including, for example, welding, brazing, and laser powder deposition.

In some of the above embodiments, the gas turbine engine component, whether a component under repair or newly manufactured, is a blade of an aircraft engine, a vane of an aircraft engine, a bucket of a power generation turbine engine, or a nozzle of a power generation turbine. Referring to FIG. 1, in particular embodiments the gas turbine engine component comprises an airfoil 10, and the airfoil comprises the alloy. Specific embodiments provide that the airfoil 10 comprises at least one of a tip section 11, a leading edge section 12, and a trailing edge section 13, and wherein at least one of said tip section 11, said leading edge section 12, and said trailing edge section 13 comprises the alloy. As described above, the alloy of the present invention is joined to the component being repaired or manufactured by any of a number of suitable techniques, such as, for example, welding and brazing. Having only particular sections (i.e., those sections known to experience the most aggressive stress-temperature combinations) of the airfoil comprise the alloy of the present invention minimizes certain drawbacks of alloys comprising significant amounts of platinum group metals such as, for example, ruthenium, rhodium, platinum, and palladium, including their high cost and high density in comparison to conventional airfoil materials. These drawbacks have a reduced effect on the overall component because the comparatively expensive and dense alloy of the present invention comprises only a fraction of the overall surface area of the component. The properties of the component are thus "tailored" to the expected localized environments, reducing the need for compromise during the design process and increasing the expected operating lifetimes for new and repaired components.

Alloys set forth herein as embodiments of the present invention are made using any of the various traditional methods of metal production and forming. Traditional casting, powder metallurgical processing, directional solidification, and single-crystal solidification are non-limiting examples of methods suitable for forming ingots of these alloys. Thermal and thermo-mechanical processing techniques common in the art for the formation of other alloys are suitable for use in manufacturing and strengthening the alloys of the present invention. For embodiments where the alloy of the present invention comprises a transition metal such as, for example, zirconium, the alloy may be given a heat-treatment in air at a temperature suitable to form a dispersion of oxide particles as described above. For situations where alloys of the present invention are joined to a Ni-base superalloy or other conventional material, heat treatments are limited to temperatures below those that will degrade or melt the conventional material.

The results presented in Example 1, below, were obtained using a typical gas turbine material, and they are presented for the purpose of comparison with the results presented in subsequent examples. Examples 2 and 3 are intended to demonstrate results obtained with alloys of the present invention and are not to be considered as limiting the scope of the present invention in any way.

EXAMPLE 1

A specimen of a typical single-crystal nickel-based superalloy was tested for oxidation resistance in air at a temperature of about 1200° C. The weight loss of the specimen was measured after exposure for 100 hours. The oxidation resistance of this material was determined based on the size of the specimen and its rate of weight loss to be about 17 hr-cm$^2$/mg.

Another specimen of the same material was tested for ultimate tensile strength, using a standard tensile test configuration, at a temperature of about 1200° C. The ultimate tensile strength of this material was determined to be about 150 MPa.

EXAMPLE 2

A specimen of an alloy of the present invention was tested for oxidation resistance in air at a temperature of about 1200° C. The alloy had the following nominal composition (in atomic percent): 21.5 Ru; 24.5 Cr; 15 Al; 38.8 Ni; 0.2 Zr. The weight loss of the specimen was measured after exposure for 100 hours. The oxidation resistance of this material was determined based on the size of the specimen and its rate of weight loss to be about 43 hr-cm$^2$/mg.

EXAMPLE 3

A specimen of an alloy of the present invention was tested for oxidation resistance in air at a temperature of about 1200° C. The alloy had the following nominal composition (in atomic percent): 30.5 Ru; 16 Cr; 14 Al; 39 Ni; 0.5 Zr. The weight loss of the specimen was measured after exposure for 100 hours. The oxidation resistance of this material was determined based on the size of the specimen and its rate of weight loss to be about 36 hr-cm$^2$/mg.

Another specimen of the same material was tested for ultimate tensile strength, using a standard tensile test configuration, at a temperature of about 1200° C. The ultimate tensile strength of this material was determined to be about 152 MPa.

While various embodiments are described herein, it will be appreciated from the specification that various combinations of elements, variations, equivalents, or improvements therein may be made by those skilled in the art, and are still within the scope of the invention as defined in the appended claims.

What is claimed is:

1. An alloy comprising:
   ruthenium, nickel, aluminum, and chromium;
   wherein a microstructure of said alloy is essentially free of an $L1_2$-structured phase at temperatures greater than about 1000° C. and comprises an A3-structured phase and up to about 40 volume percent of a B2-structured phase.

2. The alloy of claim 1, wherein said alloy has an oxidation resistance of at least about 30 hour-cm$^2$/mg at a temperature of about 1200° C.

3. The alloy of claim 2, wherein said alloy has an oxidation resistance of at least about 60 hour-cm$^2$/mg at a temperature of about 1200° C.

4. The alloy of claim 1, wherein said alloy has an ultimate tensile strength greater than about 100 MPa at a temperature of about 1200° C.

5. The alloy of claim 4, wherein said alloy has an ultimate tensile strength greater than about 150 MPa at a temperature of about 1200° C.

6. The alloy of claim 1, wherein said alloy has a density of less than about 9.5 g/cc.

7. The alloy of claim 6, wherein said alloy. has a density of less than about 9 g/cc.

8. The alloy of claim 1, wherein said B2-structured phase is present in said microstructure in an amount ranging from about 15 volume percent to about 40 volume percent.

9. The alloy of claim 8, wherein said B2-structured phase is present in said microstructure in an amount ranging from about 20 volume percent to about 35 volume percent.

10. The alloy of claim 1,
    wherein said ruthenium is present in an amount ranging from about 20 atomic percent to about 40 atomic percent;
    wherein said chromium is present in an amount ranging from about 10 atomic percent to about 28 atomic percent;
    wherein said aluminum is present in an amount ranging from about 12 atomic percent to about 24 atomic percent; and
    wherein the balance comprises nickel, wherein said nickel is present in an amount of at least about 30 atomic percent.

11. The alloy of claim 10, wherein
    said ruthenium is present in an amount ranging from about 20 atomic percent to about 25 atomic percent;
    said chromium is present in an amount ranging from about 20 atomic percent to about 25 atomic percent; and
    said aluminum is present in an amount ranging from about 13 atomic percent to about 16 atomic percent.

12. The alloy of claim 10, further comprising:
    up to about 1.5 atomic percent of a metal selected from the group consisting of zirconium, tantalum, hafnium, niobium, yttrium, molybdenum, and mixtures thereof; and
    up to about 10 atomic percent of a metal selected from the group consisting of platinum, palladium, rhodium, and mixtures thereof.

13. An alloy consisting essentially of:
    ruthenium, in an amount ranging from about 20 atomic percent to about 40 atomic percent;
    chromium, in an amount ranging from about 10 atomic percent to about 28 atomic percent;
    aluminum, in an amount ranging from about 12 atomic percent to about 24 atomic percent;
    up to about 1.5 atomic percent of a metal selected from the group consisting of zirconium, tantalum, hafnium, niobium, yttrium, molybdenum, and mixtures thereof;
    up to about 10 atomic percent of a metal selected from the group consisting of platinum, palladium, rhodium, and mixtures thereof; and
    the balance nickel, wherein said nickel is present in an amount of at least about 30 atomic percent;
    wherein a microstructure of said alloy is essentially free of an $L1_2$-structured phase at temperatures greater than about 1000° C. and comprises an A3-structured phase and from about 15 volume percent to about 40 volume percent of a B2-structured phase.

14. An alloy comprising:
    about 22 atomic percent ruthenium;
    about 25 atomic percent chromium;
    about 15 atomic percent aluminum;
    about 0.2 atomic percent zirconium; and
    the balance comprising nickel;
    wherein a microstructure of said alloy is essentially free of an $L1_2$-structured phase at temperatures greater than about 1000° C. and comprises an A3-structured phase and from about 15 volume percent to about 40 volume percent of a B2-structured phase.

15. A gas turbine engine component comprising: an alloy comprising ruthenium, nickel, aluminum, and chromium, wherein a microstructure of said alloy of said component is essentially free of an $L1_2$-structured phase at temperatures greater than about 1000° C. and comprises an A3-structured phase and up to about 40 volume percent of a B2-structured phase.

16. The gas turbine engine component of claim 15, wherein said B2-structured phase is present in said microstructure in an amount ranging from about 15 volume percent to about 40 volume percent.

17. The gas turbine engine component of claim 16, wherein said B2-structured phase is present in said microstructure in an amount ranging from about 20 volume percent to about 35 volume percent.

18. The gas turbine engine component of claim 15, wherein said alloy comprises ruthenium, in an amount ranging from about 20 atomic percent to about 40 atomic percent, chromium, in an amount ranging from about 10 atomic percent to about 28 atomic percent, aluminum, in an amount ranging from about 12 atomic percent to about 24 atomic percent, and the balance comprising nickel, wherein said nickel is present in an amount of at least about 30 atomic percent.

19. The gas turbine engine component of claim 18, wherein said ruthenium is present in an amount ranging from about 20 atomic percent to about 25 atomic percent, said chromium is present in an amount ranging from about 20 atomic percent to about 25 atomic percent, and said aluminum is present in an amount ranging from about 13 atomic percent to about 16 atomic percent.

20. The gas turbine engine component of claim 18, wherein said alloy further comprises
    up to about 1.5 atomic percent of a metal selected from the group consisting of zirconium, tantalum, hafnium, niobium, yttrium, molybdenum, and mixtures thereof; and up to about 10 atomic percent of a metal selected from the group consisting of platinum, palladium, rhodium, and mixtures thereof.

21. The gas turbine engine component of claim 15, wherein said gas turbine engine component is a blade of an aircraft engine, a vane of an aircraft engine, a bucket of a power generation turbine engine, or a nozzle of a power generation turbine.

22. The gas turbine engine component of claim 21, wherein said gas turbine engine component comprises an airfoil, and wherein said airfoil comprises said alloy.

23. The gas turbine engine component of claim 22, wherein said airfoil comprises at least one of a tip section, a leading edge section, and a trailing edge section, and wherein at least one of said tip section, said leading edge section, and said trailing edge section comprises said alloy.

24. A gas turbine engine component comprising:
an alloy comprising about 22 atomic percent ruthenium, about 25 atomic percent chromium, about 15 atomic percent aluminum, about 0.2 atomic percent zirconium, and the balance comprising nickel, wherein a microstructure of said alloy of said engine component is essentially free of an $L1_2$-structured phase at temperatures greater than about 1000° C. and comprises an A3-structured phase and from about 15 volume percent to about 40 volume percent of a B2-structured phase.

25. A repair material for repairing superalloy articles, said repair material comprising:
ruthenium, nickel, aluminum, and chromium,
wherein a microstructure of said repair material is essentially free of an $L1_2$-structured phase at temperatures greater than about 1000° C. and comprises an A3-structured phase and up to about 40 volume percent of a B2-structured phase.

26. The repair material of claim 25, wherein said repair material has an resistance of at least about 30 hour-cm²/mg at a temperature of about 1200° C.

27. The repair material of claim 26, wherein said repair material has an resistance of at least about 60 hour-cm²/mg at a temperature of about 1200° C.

28. The repair material of claim 25, wherein said repair material has an ultimate tensile strength greater than about 100 MPa at a temperature of about 1200° C.

29. The repair material of claim 28, wherein said repair material has an ultimate tensile strength greater than about 150 MPa at a temperature of about 1200° C.

30. The repair material of claim 25, wherein said repair material has a density of less than about 9.5 g/cc.

31. The repair material of claim 30, wherein said repair material has a density of less than about 9 g/cc.

32. The repair material of claim 25, wherein said B2-structured phase is present in said microstructure in an amount ranging from about 15 volume percent to about 40 volume percent.

33. The repair material of claim 32, wherein said B2-structured phase is present in said microstructure in an amount ranging from about 20 volume percent to about 35 volume percent.

34. The repair material of claim 25,
wherein said ruthenium is present in an amount ranging from about 20 atomic percent to about 40 atomic percent;
wherein said chromium is present in an amount ranging from about 10 atomic percent to about 28 atomic percent;
wherein said aluminum is present in an amount ranging from about 12 atomic percent to about 24 atomic percent; and
wherein the balance comprises nickel, wherein said nickel is present in an amount of at least about 30 atomic percent.

35. The repair material of claim 34, wherein
said ruthenium is present in an amount ranging from about 20 atomic percent to about 25 atomic percent;
said chromium is present in an amount ranging from about 20 atomic percent to about 25 atomic percent; and
said aluminum is present in an amount ranging from about 13 atomic percent to about 16 atomic percent.

36. The repair material of claim 34, further comprising up to about 1.5 atomic percent of a metal selected from the group consisting of zirconium, tantalum, hafnium, niobium, yttrium, molybdenum, and mixtures thereof; and
up to about 10 atomic percent of a metal selected from the group consisting of platinum, palladium, rhodium, and mixtures thereof.

37. A repair material for repairing superalloy articles, said repair material consisting essentially of:
ruthenium, in an amount ranging from about 20 atomic percent to about 40 atomic percent;
chromium, in an amount ranging from about 10 atomic percent to about 28 atomic percent;
aluminum, in an amount ranging from about 12 atomic percent to about 24 atomic percent;
up to about 1.5 atomic percent of a metal selected from the group consisting of zirconium, tantalum, hafnium,, niobium, yttrium, molybdenum, and mixtures thereof; and
up to about 10 atomic percent of a metal selected from the group consisting of platinum, palladium, rhodium, and mixtures thereof; and
the balance nickel, wherein said nickel is present in an amount of at least about 30 atomic percent;
wherein a microstructure of said repair material is essentially free of an $L1_2$-structured phase at temperatures greater than about 1000° C. and comprises an A3-structured phase and up to about 40 volume percent of a B2-structured phase.

38. A repair material for repairing superalloy articles, said repair material comprising:
about 22 atomic percent ruthenium;
about 25 atomic percent chromium;
about 15 atomic percent aluminum;
about 0.2 atomic percent zirconium; and
the balance comprising nickel;
wherein a microstructure of said repair is essentially free of an $L1_2$-structured phase at temperatures greater than about 1000° C. and comprises an A3-structured phase and up to about 40 volume percent of a B2-structured phase.

39. A repaired gas turbine engine component comprising:
a repair material comprising ruthenium, nickel, aluminum, and chromium, wherein a microstructure of said repair material of said engine component is essentially free of an $L1_2$-structured phase at temperatures greater than about 1000° C. and comprises an A3-structured phase and up to about 40 volume percent of a B2-structured phase.

40. The repaired gas turbine engine component of claim 39, wherein said B2-structured phase is present in said microstructure in an amount ranging from about 15 volume percent to about 40 volume percent.

41. The repaired gas turbine engine component of claim 40, wherein said B2-structured phase is present in said microstructure in an amount ranging from about 20 volume percent to about 35 volume percent.

42. The repaired gas turbine engine component of claim 39, wherein said repair material comprises ruthenium, in an amount ranging from about 20 atomic percent to about 40 atomic percent, chromium, in an amount ranging from about 10 atomic percent to about 28 atomic percent, aluminum, in an amount ranging from about 12 atomic percent to about 24 atomic percent, and the balance comprising nickel, wherein said nickel is present in an amount of at least about 30 atomic percent.

43. The repaired gas turbine engine component of claim 42, wherein said ruthenium is present in an amount ranging from about 20 atomic percent to about 25 atomic percent, said chromium is present in an amount ranging from about 20 atomic percent to about 25 atomic percent, and said aluminum is present in an amount ranging from about 13 atomic percent to about 16 atomic percent.

44. The repaired gas turbine engine component of claim 42, wherein said repair material further comprises up to about 1.5 atomic percent of a metal selected from the group consisting of zirconium, tantalum, hafnium, niobium, yttrium, molybdenum, and mixtures thereof; and up to about 10 atomic percent of a metal selected from the group consisting of platinum, palladium, rhodium, and mixtures thereof.

45. The repaired gas turbine engine component of claim 39, wherein said repaired gas turbine engine component is a blade of an aircraft engine, a vane of an aircraft engine, a bucket of a power generation turbine engine, or a nozzle of a power generation turbine.

46. The repaired gas turbine engine component of claim 45, wherein said repaired gas turbine engine component comprises an airfoil, and wherein said airfoil comprises said repair material.

47. The repaired gas turbine engine component of claim 46, wherein said airfoil comprises at least one of a tip section, a leading edge section, and a trailing edge section, and wherein at least one of said tip section, said leading edge section, and said trailing edge section comprises said repair material.

48. A repaired gas turbine engine component comprising:
    a repair material comprising about 22 atomic percent ruthenium, about 25 atomic percent chromium, about 15 atomic percent aluminum, about 0.2 atomic percent zirconium, and the balance comprising nickel, wherein a microstructure of said repair material of said engine component is essentially free of an $L1_2$-structured phase at temperatures greater than about 1000° C. and comprises an A3-structured phase and from about 15 volume percent to about 40 volume percent of a B2-structured phase.

49. A method for repairing a gas turbine engine component, said method comprising:
    providing a repair material, said repair material comprising ruthenium, nickel, aluminum, and chromium, wherein a microstructure of said repair material is essentially free of an $L1_2$-structured phase at temperatures greater than about 1000° C. and comprises an A3-structured phase and up to about 40 volume percent of a B2-structured phase; and
    joining said repair material to said gas turbine engine component.

50. The method of claim 49, wherein providing comprises providing said repair material wherein said B2-structured phase is present in said microstructure in an amount ranging from about 15 volume percent to about 40 volume percent.

51. The method of claim 50, wherein providing comprises providing said repair material wherein said B2-structured phase is present in said microstructure in an amount ranging from about 20 volume percent to about 35 volume percent.

52. The method of claim 49, wherein providing comprises providing said repair material, wherein said ruthenium is present in an amount ranging from about 20 atomic percent to about 40 atomic percent, wherein said chromium is present in an amount ranging from about 10 atomic percent to about 28 atomic percent, wherein said aluminum is present in an amount ranging from about 12 atomic percent to about 24 atomic percent, and wherein the balance comprises nickel, wherein said nickel is present in an amount of at least about 30 atomic percent.

53. The method of claim 52, wherein said ruthenium is present in an amount ranging from about 20 atomic percent to about 25 atomic percent, said chromium is present in an amount ranging from about 20 atomic percent to about 25 atomic percent, and said aluminum is present in an amount ranging from about 13 atomic percent to about 16 atomic percent.

54. The method of claim 52, wherein said repair material further comprises up to about 1.5 atomic percent of a metal selected from the group consisting of zirconium, tantalum, hafnium, niobium, yttrium, molybdenum, and mixtures thereof; and up to about 10 atomic percent of a metal selected from the group consisting of platinum, palladium, rhodium, and mixtures thereof.

55. The method of claim 49, wherein said gas turbine engine component is a blade of an aircraft engine, a vane of an aircraft engine, a bucket of a power generation turbine engine, or a nozzle of a power generation turbine.

56. The method of claim 55, wherein said gas turbine engine component comprises an airfoil, and wherein joining comprises joining said repair material to said airfoil.

57. The method of claim 56, wherein said airfoil comprises at least one of a tip section, a leading edge section, and a trailing edge section, and wherein joining further comprises joining said repair material to at least one of said tip section, said leading edge section, and said trailing edge section.

58. A method of repairing a gas turbine engine component, said method comprising:
    providing a repair material, the repair material comprising about 22 atomic percent ruthenium, about 25 atomic percent chromium, about 15 atomic percent aluminum, about 0.2 atomic percent zirconium, and the balance comprising nickel, wherein a microstructure of said repair material is essentially free of an $L1_2$-structured phase at temperatures greater than about 1000° C. and comprises an A3-structured phase and from about 15 volume percent to about 40 volume percent of a B2-structured phase; and
    joining said repair material to at least one of a leading edge section, a trailing edge section, and a tip section of an airfoil of said gas turbine engine component.

* * * * *